United States Patent

Mapother et al.

[15] 3,699,406

[45] Oct. 17, 1972

[54] SEMICONDUCTOR GATE-CONTROLLED PNPN SWITCH

[72] Inventors: Thomas C. Mapother, Liverpool; Richard L. Wilson, Baldwinsville, both of N.Y.

[73] Assignee: General Electric Company

[22] Filed: Dec. 26, 1963

[21] Appl. No.: 333,478

[52] U.S. Cl...317/235 R, 317/235 AB, 317/235 AA, 317/235 Y, 317/235 AM

[51] Int. Cl.............................H01l 9/12, H01l 11/10

[58] Field of Search..307/88.5; 317/235 G, 234, 235, 317/235 A

[56] References Cited

UNITED STATES PATENTS

| | | | |
|---|---|---|---|
| 2,981,877 | 4/1961 | Noyce | 317/235 |
| 3,177,414 | 4/1965 | Kurosawa et al. | 317/235 A |
| 3,178,804 | 4/1965 | Ullery, Jr. et al. | 317/234 X |
| 3,197,681 | 7/1965 | Broussard | 317/235 |
| 3,260,902 | 7/1966 | Porter | 317/235 |

*Primary Examiner*—Martin H. Edlow
*Attorney*—Robert J. Mooney, Nathan J. Cornfeld, Melvin M. Goldenberg, Frank L. Neuhauser and Oscar B. Waddell

[57] ABSTRACT

A PNPN controlled switch is provided wherein all four active regions and the three junctions therebetween terminate at a common major face of a semiconductor body. Adjacent the carrier path between emitter and collector there is provided a region of hither concentration to trap some of the carriers leaving the emitter.

11 Claims, 6 Drawing Figures

INVENTORS:
THOMAS C. MAPOTHER,
RICHARD L. WILSON,
BY Robert J. Mooney
THEIR ATTORNEY.

INVENTORS:
THOMAS C. MAPOTHER,
RICHARD L. WILSON,
BY Robert J. Mooney
THEIR ATTORNEY.

SEMICONDUCTOR GATE-CONTROLLED PNPN SWITCH

The present invention relates to improvements in semiconductor switch devices of the type which can be controllably switched between a state of high impedance and a state of low impedance, and more particularly to improvements in PNPN controlled switches of the junction semiconductor type.

Prior art four-region three-junction semiconductor devices of the PNPN controlled switch type have certain disadvantageous characteristics, among which are excessive leakage currents, less than desired passivation of all three junctions, diminished suitability for handling small signals, and lower than desirable turn-off gain. Such devices also sometimes require a larger than desired signal to produce turn-off, i.e. to render the device non-conducting in the forward direction, and involve semiconductor bodies of undesirably large size and proportionately large cost.

Accordingly, one object of the present invention is to provide a three-junction semiconductor PNPN controlled switch which has an improved turn-off gain and is hence capable of being turned off in response to a turn-off signal of reduced amplitude.

Another object is to provide a PNPN switch having all three junctions fully and permanently passivated.

Another object s to provide a PNPN switch of the foregoing character having a four-region semiconductor body of planar or wafer-like configuration and with all four of its respective electrodes attached to a common face of the semiconductor body.

Another object is to provide a four-region semiconductor device of the foregoing character manufacturable by a process involving only two conductivity type-determining impurity impregnation steps.

Another object is to provide a device of the foregoing character having minimized leakage currents in relation to turn-on or firing current and equal in the forward and reverse directions.

Briefly, according to one important aspect of the present invention, a PNPN controlled switch is provided wherein all four active regions, and the entire peripheries of the three junctions therebetween, terminate at a common major face of a wafer-shaped body of semiconductor material. According to another important aspect of the invention, there is provided adjacent the flow path of the charge carriers between the emitter and collector region of one of the transistor analogue portions of the device a region having a sufficient impurity concentration to trap or scavenge some of the carriers leaving the emitter and thereby prevent them from reaching the collector, so as to diminish the effective beta of such transistor analogue portions of the device. By reducing the transistor beta, this trapping effect lessens the amount of turn-off current, and correspondingly reduces the amplitude of the turn-off signal required at the cathode gate, to turn the device off. Since the turn-off gain of the device is by definition equal to the quotient of the anode current and the turn-off gate current, it will be evident that a reduction in the turn-off gate current provides an increase in the turn-off gain.

Figure 1:
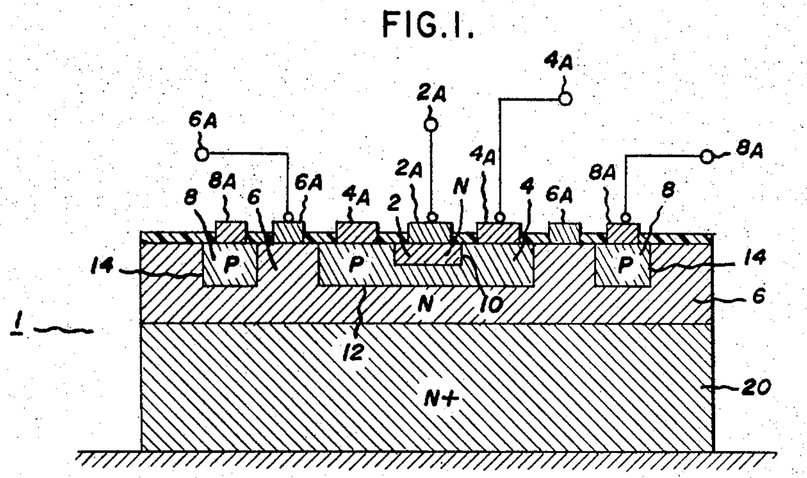
FIG. 1 shows an enlarged fragmentary diagrammatic sectional view of a PNPN controlled switch constructed in accordance with the present invention.

Referring to FIG. 1, the PNPN controlled switch there shown is formed in a plate-like or wafer-like body 1 of semiconductor material such as N conductivity type silicon having a resistivity of, for example, about 3 ohm centimeters, and includes an N-type cathode 2 having a cathode contact 2A, P-type cathode gate 4 having a cathode gate contact 4A, N-type anode gate 6 having an anode gate contact 6A, and P-type anode 8 having an anode contact 8A. All three junctions, namely the cathode-cathode gate junction 10, cathode gate-anode gate junction (or collector junction) 12 and anode gate-anode junction 14, terminate entirely on the upper major face of the semiconductor wafer 1 beneath a junction-protecting and passivating layer such as silicon dioxide or other suitable material. The various regions separated by the junctions 10, 12 and 14 may be conveniently formed, by example, by successive diffusion steps into the top face of the wafer 1 of respective P and N-type impurities in accordance with the oxide coating, masking, etching and diffusion techniques described, for example, in British Pat. No. 864,705. Boron may be diffused to form the P-regions 4 and 8, and phosphorus to form the N-region 2. The anode contact 8A, cathode-gate contact 4A and cathode contact 2 may be aluminum, vacuum evaporated. The oxide coating formed on the upper face of the wafer may be left permanently in place for passivation purposes in accordance with the teaching of U.S. Pat. No. 2,858,489. Individual devices as above described may be mechanically supported by soldering the bottom face to a suitable header 30 with donor-doped gold solder making an ohmic contact thereto. Suitable leads of wire or the like may be likewise bonded ohmically to contacts 2A, 4A, 6A and 8A.

Figure 2:
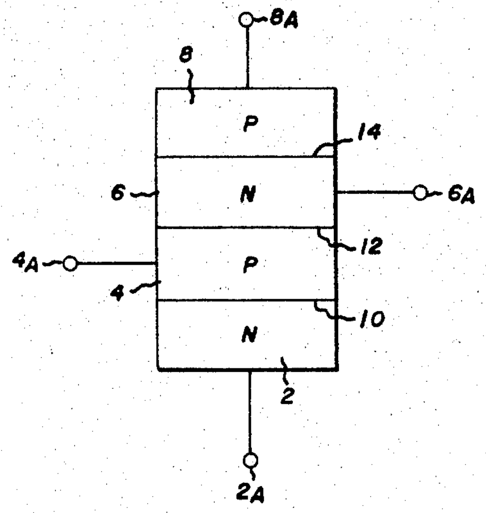
FIGS. 2 and 3 are simplified schematic diagrams of PNPN devices useful in explaining the operation of the device of FIG. 1.
Figure 3:
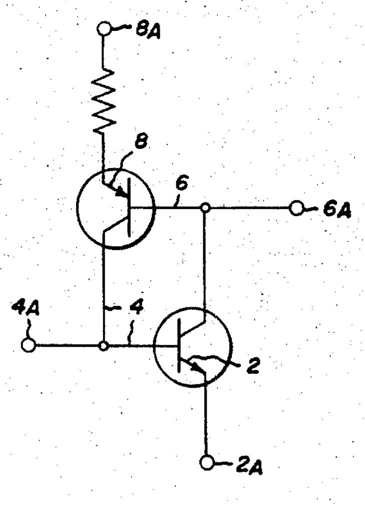

As is known to those skilled in the art, the operation of a PNPN switch of the four-region or three-junction type is conventionally explained in accordance with the two-transistor analogy shown, for example, in FIGS. 2 and 3, and also described in connection with Figure 19.5 on page 339 of the General Electric Company Transistor Manual, Sixth Edition, copyright 1962 by the General Electric Company. The reference characters applied to the various regions shown in FIGS. 2 and 3 correspond to those employed in FIG. 1. Hence it will be evident that the anode 8, anode gate 6, and cathode gate 4 correspond to the emitter, base and collector, respectively, of a PNP transistor, while the cathode 2, cathode gate 4, and anode gate 6 correspond, respectively, to the emitter, base and collector of an NPN transistor. The base of the NPN transistor is common with the collector of the PNP transistor and is the region 4, and the collector of the NPN transistor is common with the base of the PNP transistor and is the region 6.

As is known to those skilled in the art, the PNPN switch may be converted from a high series impedance, reverse-biased, state capable of holding back a large voltage applied between the anode and cathode to a forward- biased condition exhibiting a low series impedance between the anode and cathode by production of a regenerative current flow in a closed loop current path within the device. This closed loop current path extends from the cathode gate 4 or base of the NPN transistor through the base-to-collector junction 12 of the NPN transistor to the base of the PNP transistor or anode gate 6 and thence back through the base-to-collector junction 12 of the PNP transistor to the base of the NPN transistor or cathode gate 4. When the product of the betas, or sum of the alphas, of the two transistors is equal to or greater than unity, a regenerative effect is produced in the above-defined current loop which biases all three junctions 10, 12 and 14 in the forward direction and switches the PNPN device to the "on" condition such that it exhibits a low series resistance from anode to cathode. Conversely, when the product of the betas or sum of the alphas of the two transistors falls below unity, the junction 12 reverts to a state of reverse bias and the device reverts to a turned-off condition exhibiting high series impedance from anode to cathode. The switch may be turned off by reducing the anode-to-cathode voltage such that the betas of the two transistors, which are current dependent, fall to a point where their product is less than unity. The switch may also be turned off by applying a negative polarity signal to the cathode gate 4 sufficient to reduce current flow through the NPN transistor 2, 4, 6 (or by applying a positive polarity signal to the anode gate 6 sufficient to reduce current through the PNP transistor 8, 6, 4), such that the product of the transistor betas is made less than unity.

Adjacent to the path of current carriers flowing in the base region of one of the transistor portions of the switch, and shown by way of example in FIG. 1 as arranged beneath the N-type anode gate region so as to be effectively adjacent the path of carriers between the emitter and collector of the PNP transistor, we provide a carrier scavenging or trap region 20 in the form of a more heavily doped N+ region of lowered carrier lifetime relative to the remainder of the anode gate region. The trap region 20 may be produced in any suitable convenient manner, for example, by epitaxial growth onto region 6 or by suitable diffusion of impurities therein so that the trap region 20 is in non-rectifying contact with the region 6 though of greater impurity concentration than region 6. With silicon as the host lattice of pellet 1, the region 6 may have an impurity concentration of, for example, $10^{17}$ atoms per cubic centimeter of a donor impurity such as phosphorus while the region 20 may have an impurity concentration of $10^{20}$ atoms per cubic centimeter of a donor impurity such as phosphorus.

The effect of the presence of trap region 20 is to reduce the beta of the transistor whose base region carrier flow path is adjacent to this region 20. In FIG. 1, the region 20 beneath the anode gate region 6 traps some of the holes which leave the anode 8, when the switch is in the forward-biased or "on" condition, and hence diminishes the number of holes leaving anode 8 which arrive at the collector junction 12 and sustain or produce current flow across the junction 12. Since the beta of the PNP transistor is proportional to the hole current flow across the junction 12, a reduction in hole current flow across the junction 12 produces a corresponding reduction in beta of the PNP transistor, thereby diminishing the degree to which the turn-off signal applied to the cathode gate must further decrease the beta of the NPN transistor sufficiently to lower the product of the betas to below unity and thereby turn the device off. Thus, the presence of the trap region 20 and its effect on diminishing the flow of holes between anode 8 and cathode gate 4 increases the turn-off sensitivity of the device and enables the device to be turned off by a smaller cathode gate signal than would otherwise be possible. For example, in practice it is found that devices having anode-to-cathode currents of 100 milliamperes in the "on" condition and having turn-off gains of as high as 40 to 50 are readily obtainable in accordance with the present invention, in comparison with turn-off gains of 5 to 10 in prior art PNPN switches having similar anode-to-cathode currents in the "on" condition.

Figure 4:
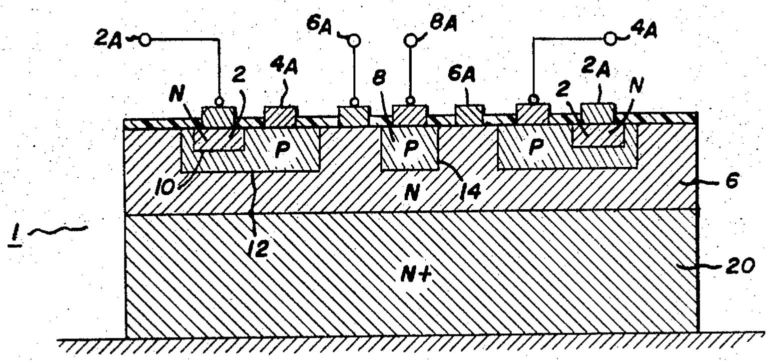
FIG. 4 is an alternative embodiment of the structure of FIG. 1, constructed according to the present invention.
Figure 5:
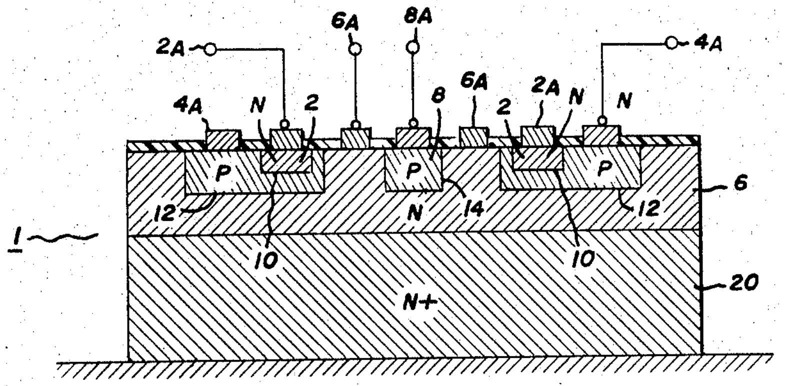
FIG. 5 is another alternative embodiment of FIG. 1 constructed according to the present invention.
Figure 6:
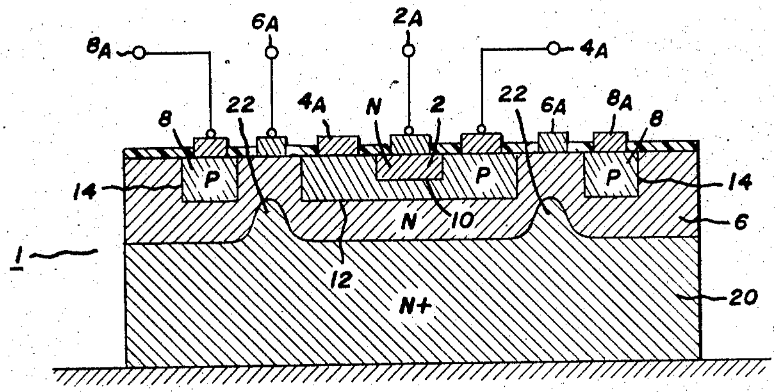
FIG. 6 shows another alternative embodiment similar to that of FIG. 1.

FIG. 4 shows an alternative embodiment wherein the cathode and cathode gate are annular, and surround the anode, being spaced therefrom by an annular anode gate region. FIG. 5 is another alternative embodiment wherein the cathode surrounds but is nearer to the anode than the arrangement of FIG. 4. The structure of FIG. 5 minimizes the length of the electrical charge carrier path from anode to cathode, and hence provides a device of minimum forward voltage drop and minimum on-holding current. FIG. 6 is another alternative embodiment similar to FIG. 1 except that the trap region 20 has upstanding portions 22 which further constrict the carrier flow path between anode 8 and cathode gate 4, and hence decrease the beta of the PNP transistor to an even greater degree than it is diminished in the structure of FIG. 1, with the result that turn-off sensitivity and turn-off gain are further increased.

Four-region semiconductor switch devices constructed according to our invention have a number of advantages. It will be evident that the planar configuration shown in FIG. 1 has the advantage that the entirety of all three junctions 10, 12, 14 may be permanently passivated with resulting reduced leakage current by an appropriate treatment of the upper major face of wafer 1. Only two impurity diffusion steps are required to form the P regions 4 and 8 in the N region 6 and the N region 2 in the P region 4, and electrode contacts to all four regions 2, 3, 6 and 8 can all be situated on the common upper major face of the wafer 1. Moreover, the annular shape of the cathode gate and cathode gate contact enables all portions of the cathode gate to be simultaneously responsive to an applied gate signal, and minimizes the problem in prior art PNPN switches of localization of effect of the gate signal to only a small portion of the gate region, with attendant undesired heating of that portion of the gate region. Also, the planar configuration shown provides for an anode-to-cathode current path which is essentially parallel to the top surface of wafer 1, and the important dimensions of the regions 2, 4, 6 and 8 in this direction parallel to the top of wafer 1 are readily controlled by the masking steps of the diffusion process of forming these regions, so that these important dimensions can be easily accurately controlled during manufacture in contrast to the more difficult dimensional controls, such as control of diffusion depth or control of tolerances on wafer thickness required with prior art PNPN devices wherein the four regions are essentially vertically stacked. Furthermore, with the planar configuration shown, the physical size of the active portion of the wafer 1 may be minimized relative to current handling capacity of the device for maximum material utilization and attendant reduction in material cost. Additionally, the planar configuration further permits both NPN and PNP transistor portions of the device to be designed by known techniques to have any desired respective beta characteristics, with excellent control by the diffusion mask of the critical physical spacing of the regions 2, 4, 6, 8 on the surface of the wafer 1, and resulting excellent reproducibility of electrical characteristics as well as low manufacturing cost. Also, the region 20 shown in FIG. 1 may be formed conveniently and easily by known techniques such as epitaxial growth or diffusion from either of the major faces of the semiconductor wafer.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description, but will be defined in the following claims.

What we claim as new and desire to secure by Letters patent of the United States is:

1. A PNPN semiconductor controlled switch comprising a wafer-like body of semiconductor material having opposed major faces, a cathode region in said body of one conductivity type and defined by a first PN junction extending to said one major face, a cathode gate region of opposite conductivity type in said body extending to said one major face concentrically adjacent said cathode and separated from said cathode by said first PN junction, an anode region of said opposite conductivity type in said body extending to said one major face concentrically with said cathode region and defined by a second PN junction extending to said one major face, and an anode gate region of said one conductivity type in said body concentric to and forming a third PN junction with said cathode gate region and extending between said third and second PN junctions, each set of the adjacent three of said regions constituting an analog transistor of which the middle region of the set serves as the base as well as the collector of the analog transistor constituted by the other set.

2. In a PNPN controlled switch, a body of semiconductor material having opposed major faces, a series of four active regions in said body extending to one major face of said body, adjacent regions of said series being of different conductivity type and forming three respective PN junctions which terminate entirely at said one major face of said body, an insulating layer on said one major face covering the entirety of the intersection of each of said junctions with said one major face, said four active regions consisting of a cathode region of one conductivity type, an anode region of opposite conductivity type spaced from said cathode, an anode gate region of said one conductivity type situated between said anode region and said cathode region, and a cathode gate region of said opposite conductivity type situated between said anode gate region and said cathode region, respective metallic contacts on said major face to at least said anode region and cathode region and one of said gate regions, said anode and anode gate and cathode gate regions constituting a first analog transistor of which the anode gate is the base and the cathode gate the collector, and said cathode and cathode gate and anode gate constituting a second analog transistor of which the cathode gate is the base and the anode gate is the collector, whereby the resistance exhibited between the anode contact and the cathode contact switches from a relatively high value to a relatively low value when the product of the betas or sum of the alphas of said first and second analog transistors equals or exceeds unity a charge carrier trapping region situated adjacent the flow path of charge carriers between said anode-gate-to cathode-gate junction and one of the other junctions, said trapping region consisting of a region of said semiconductor material having an impurity concentration higher than that of the particular active region between said anode-gate-to-cathode-gate junction and said one other junction, said trapping region having the same conductivity type as said particular active region.

3. A PNPN controlled switch comprising a body of semiconductor material having opposed major faces, a series of four active regions in said body extending to one major face of said body, adjacent regions of said series being of different conductivity type and defining therebetween three respective PN junctions which terminate entirely at said one major face of said body, an insulating layer on said one major face covering the entirety of the intersection of each of said junctions with said one major face, said four active regions consisting of a cathode of one conductivity type, a cathode gate of opposite conductivity type adjacent said cathode, an anode gate of said one conductivity type adjacent said cathode gate, and an anode of said opposite conductivity type adjacent said anode gate, each set of three adjacent regions of said series constituting an analog transistor of which the middle region of the set serves as the base as well as the collector of the analog transistor constituted by the other set and a charge carrier trapping region situated adjacent and extending partially into the flow path of charge carriers between said anode-gate-to-cathode-gate junction and another of said junctions said trapping region consisting of a region of said semiconductor material having the same conductivity type and a higher impurity concentration than the particular active region between said anode-gate-to-cathode-gate junction and said other junction.

4. A PNPN semiconductor controlled switch comprising a wafer-like body of semiconductor material having opposed major faces, a cathode region in said body of one conductivity type and defined by a first PN junction terminating entirely at said one major face, a cathode gate region of opposite conductivity type in said body extending to said one major face concentrically adjacent said cathode and separated from said cathode by said first PN junction, an anode region of said opposite conductivity type in said body extending to said one major face concentrically with said cathode region and defined by a second PN junction extending to said one major face, an anode gate region of said one conductivity type in said body concentric to and forming a third PN junction with said cathode gate region and extending between said third and second PN junctions, each set of three adjacent regions of the four regions of said body separated by said three PN junctions constituting an analog transistor of which the middle region of the set serves as the base as well as the collector of the analog transistor constituted by the other set, and a charge carrier trapping region in said body having said one conductivity type and having a higher impurity concentration than said anode gate region, said trapping region extending partially into the flow path of carriers between said second and third PN junctions.

5. A PNPN semiconductor controlled switch comprising a wafer-like body of semiconductor material having opposed major faces, a cathode region in said body of one conductivity type and defined by a first PN junction terminating entirely at said one major face, a cathode gate region of opposite conductivity type in said body extending to said one major face concentrically adjacent said cathode and separated from said cathode by said PN junction, an anode region of said opposite conductivity type in said body extending to said one major face concentrically with said cathode region and defined by a second PN junction extending to said one major face, an anode gate region of said one conductivity type in said body concentric to and forming a third PN junction with said cathode gate region and extending between said third and second PN junctions, each set of three adjacent regions of the four regions of said body separated by said three PN junctions constituting an analog transistor of which the middle region of the set serves as the base as well as the collector of the analog transistor constituted by the other set, and means associated with said body situated adjacent the flow path of charge carriers between said third junction and another of said junctions for trapping carriers flowing between said third junction and another of said junctions.

6. A PNPN semiconductor controlled switch comprising a wafer-like body of semiconductor material having opposed major faces, an annular cathode region in said body of one conductivity type and defined by a first PN junction terminating entirely at said one major face, an annular cathode gate region of opposite conductivity type in said body extending to said one major face adjacent said cathode and separated from said cathode by said first PN junction, an anode region of said opposite conductivity type in said body surrounded by said cathode and extending to said one major face and defined by a second PN junction extending to said one major face, and an annular anode gate region of said one conductivity type in said body forming a third PN junction with said cathode gate region and extending between said third and second PN junctions, each set of three adjacent regions of the four regions of said body separated by said three PN junctions constituting an analog transistor of which the middle region of the set serves as the base as well as the collector of the analog transistor constituted by the other set, and an epitaxial carrier trapping region in said body extending beneath said anode gate region adjacent the flow path of carriers between said anode and cathode gate regions, said carrier trapping region having the same conductivity type and a higher impurity concentration than said anode gate region.

7. A PNPN semiconductor controlled switch comprising a wafer-like body of semiconductor material having opposed major faces, an anode region in said body of one conductivity type and defined by a first PN junction extending to said one major face, an anode gate region of opposite conductivity type in said body extending to said one major face concentrically adjacent said anode and separated from said anode by said first PN junction, a cathode region of said opposite conductivity type in said body extending to said one major face concentric with said anode region and defined by a second PN junction extending to said one major face, and a cathode gate region of said one conductivity type in said body concentric to and forming a third PN junction with said anode gate region and extending between said third and second PN junctions, respective metallic contacts on said major face to at least said anode and cathode and one of said gate regions, an insulating layer on said one major face covering the entirety of the intersection of each of said junctions with said one major face, at least the first and third of the set of four of said regions separated by said three PN junctions having the same dimension measured perpendicularly to said one major face, said anode and anode gate and cathode gate regions constituting a first analog transistor of which the anode gate is the base and the cathode gate is the collector, and said cathode and cathode gate and anode gate regions constituting a second analog transistor of which the cathode gate is the base and the anode gate is the collector, whereby the resistance exhibited between the anode contact and the cathode contact switches from a relatively high value to a relatively low value when current flow across the anode-gate-to-cathode-gate junction reaches a level such that the product of the betas or sum of the alphas of said first and second analog transistors equals or exceeds unity.

8. A PNPN semiconductor controlled switch as defined in claim 7 wherein said cathode gate region has an annular shape, and said cathode region has an annular shape and is situated entirely within said cathode gate region.

9. A semiconductor device comprising a body of semiconductor material including four zones of alternating conductivity type;

the first zone of said body being of one conductivity type and having a surface area in a surface of the body;

a first ohmic connection to the first zone at said surface area;

the second zone of said body being of opposite conductivity type, lying intermediate said first zone and the remaining zones of said body, and having a surface area in said surface of the body encircling the surface area of the first zone;

a second ohmic connection to the second zone at the surface area of the second zone;

the third zone of said body being of the one conductivity type, lying intermediate said first and second zones and the fourth zone of said body, and having a surface area in said surface of the body contiguous the surface area of the second zone;

the fourth zone being of the opposite conductivity type, lying contiguous the third zone, and having a surface area in said surface of the body; and a third ohmic connection to the fourth zone at the surface area of the fourth zone;

the first, second, and third zones having an effective alpha which is high but less than unity and the second, third, and fourth zones having an effective alpha which is low, the sum of said alphas becoming greater than unity when current flows into said second zone from said second ohmic connection causing current to flow through the device;

the distance between the fourth zone and the second ohmic connection being less than the distance between the fourth zone and the first zone whereby current flowing through the device from the fourth zone toward the first zone passes adjacent the second ohmic connection before reaching the first zone.

10. A semiconductor device comprising a body of semiconductor material including a substrate of semiconductor material of one conductivity type;

a layer of semiconductor material contiguous said substrate;

said layer including a first zone of the one conductivity type having a surface area in a surface of the layer;

said layer including a second zone of the opposite type, said second zone lying contiguous said first zone and intermediate the first zone and the remainder of said layer, and having a surface area in said surface of the layer encircling the surface area of the first zone;

said layer including a third zone of the opposite conductivity type, said third zone being spaced from said first and second zones and having a surface area in said surface of the layer spaced from the surface areas of the first and second zones;

the remaining portion of said layer including a region of the one conductivity type contiguous said substrate, said second zone, and said third zone, said remaining portion having a surface area in said surface encircling the surface area of the second zone and encircling the surface area of the third zone;

an ohmic connection to the surface area of the first zone;

an ohmic connection to the surface area of the second zone; and an ohmic connection to the surface area of the third zone;

the first zone, the second zone, and said remaining portion of said layer having an effective alpha which is high but less than unity and the second zone, said remaining portion of said layer, and the third zone having an effective alpha which is low, the sum of said alphas being greater than unity when current flows into said second zone from the ohmic connection to the second zone causing current flow through the device;

the ohmic connection to the second zone being located intermediate the ohmic connections to the first and third zones whereby current flowing through the device from the third zone toward the first zone passes adjacent the ohmic connection to the second zone before reaching the first zone.

11. A semiconductor device comprising a body of semiconductor material including four zones of alternating conductivity type and having a flat surface;

the first zone of said body being of the one conductivity type of graded resistivity and having a surface area in said surface of the body;

the second zone of said body being of the opposite conductivity type of graded resistivity, lying intermediate said first zone and the remaining zones of said body, and having a surface area in said surface of the body encircling the surface area of the first zone;

the surface area of the first zone lying farther from a portion of the edge of the surface area of the second zone than from the remainder of the edge;

the third zone of said body being of the one conductivity type, lying intermediate said first and second zones and the fourth zone of said body, and having a surface area in said surface of the body contiguous the surface area of the second zone;

said third zone the a substrate of low resistivity semiconductor material separated from the first, second, and fourth zones by the remaining portion of the third zone, said substrate having a flat interface with the remaining portion of the third zone parallel to said surface of the body;

the fourth zone of said body being of the opposite conductivity type of graded resistivity and having a surface area in said surface of the body encircled by the surface area of the third zone;

the surface area of the fourth zone lying closer to said portion of the edge of the surface area of the second zone than to the remainder of the edge;

an ohmic connection to the surface area of the first zone;

an ohmic connection to the surface area of the second zone;

an ohmic connection to the surface area of the fourth zone; and the first, second, and third zones having an effective alpha which is high but less than unity and the second, third, and fourth zones having an effective alpha which is low, the sum of said alphas becoming greater than unity when current flows into said second zone from the ohmic connection to the second zone causing current to flow through the device;

the ohmic connection to the second zone being located intermediate the ohmic connections to the first and forth zones whereby current flowing through the device from the fourth zone toward the first zone passes adjacent the ohmic connection to the second zone before reaching the first zone.

* * * * *